United States Patent [19]
Summerfelt et al.

[11] Patent Number: 5,609,927
[45] Date of Patent: Mar. 11, 1997

[54] PROCESSING METHODS FOR HIGH-DIELECTRIC-CONSTANT MATERIALS

[75] Inventors: Scott R. Summerfelt, Dallas; Howard R. Beratan, Richardson; Robert Tsu, Plano, all of Tex.

[73] Assignee: Texas Instruments Incorporated, Dallas, Tex.

[21] Appl. No.: 476,950

[22] Filed: Jun. 6, 1995

[51] Int. Cl.$^6$ ......................................... B05D 3/06
[52] U.S. Cl. ..................... 427/553; 427/404; 427/419.2; 427/419.3; 134/1; 216/101
[58] Field of Search ................................. 427/553, 533, 427/534, 539, 404, 126.3, 419.2, 419.3; 216/101; 134/1

[56] References Cited

U.S. PATENT DOCUMENTS 5,039,376  8/1991  Zukotynski et al. ............... 156/643
5,048,163  9/1991  Asmus et al. ........................ 29/25.01

FOREIGN PATENT DOCUMENTS 4-89246  3/1992  Japan.

*Primary Examiner*—Roy V. King
*Attorney, Agent, or Firm*—Brian A. Carlson; James C. Kesterson; Richard L. Donaldson

[57] ABSTRACT

Processing techniques for processing high-dielectric-constant material are provided to allow for the formation of an electronic device (10) which comprises a inner electrode (24), a high-dielectric-constant layer (28), and an outer electrode (30). High-dielectric-constant layer (28) is subjected to ultraviolet radiation in an oxygen ozone ambient to eliminate various undesirable hydroxide and carbonate compounds. Layer (28) is further subjected to high pressure isotropic reactive ion etches prior to the deposition of layer (30). The interface between layer (28) and layer (30) is exposed to reactive fluorine and low pressure plasma to improve the fair electric properties and leakage currents associated with layer (28).

3 Claims, 1 Drawing Sheet

PROCESSING METHODS FOR HIGH-DIELECTRIC-CONSTANT MATERIALS

RELATED APPLICATIONS

This application is related to U.S. patent application Ser. No. 08/476,948, filed Jun. 6, 1995, entitled "Semiconductor Structures Using High-Dielectric-Constant Materials and An Adhesion Layer and Method for Forming the Same," (Attorney's Docket No. 19508) and U.S. patent application Ser. No. 08/481,661, filed Jun. 6, 1995, entitled "Method of Forming Inner Electrodes in High Density, High-Dielectric-Constant Memory Devices".

The following previously-filed applications are related to the instant application:

U.S. patent application Ser. No. 08/283,881, now U.S. Pat. No. 5,566,045 entitled "Improved High-Dielectric-Constant Material Electrodes Comprising Thin Platinum Layers" invented by Summerfelt, Beratan, Kirlin, and Gnade;

U.S. patent application Ser. No. 08/283,468, filed Aug. 1, 1994, entitled "Improved Electrodes Comprising Conductive Perovskite-Seed Layers for Perovskite Dielectrics" invented by Summerfelt and Beratan, now abandoned;

U.S. patent application Ser. No. 08/283,442, filed Aug. 1, 1994, entitled "Improved High-Dielectric-Constant Material Electrodes Comprising Thin Ruthenium Dioxide Layers" invented by Summerfelt, Beratan, Kirlin and Gnade now abandoned;

U.S. patent application Ser. No. 08/283,467, now U.S. Pat. No. 5,554,564 entitled "Pre-Oxidizing High-Dielectric-Constant Material Electrodes" invented by Nishioka, Summerfelt, Park and Bhattacharya.

U.S. patent application Ser. No. 08/283,871, now U.S. Pat. No. 5,489,548 entitled "High-Dielectric-Constant Material Electrodes Comprising Sidewall Spacers" invented by Nishioka, Park, Bhattacharya and Summerfelt;

U.S. patent application Ser. No. 08/283,441, filed Aug. 1, 1994, entitled "A Conductive Amorphous-Nitride Barrier Layer for High-Dielectric-Constant Material Electrodes" invented by Summerfelt;

U.S. patent application Ser. No. 08/283,873, now U.S. Pat. No. 5,504,041 entitled "A Conductive Exotic-Nitride Barrier Layer for High-Dielectric-Constant Material Electrodes" invented by Summerfelt;

U.S. patent application Ser. No. 08/276,191, filed Jul. 15, 1994, entitled "Lightly Donor-Doped Electrodes for High-Dielectric-Constant Materials" invented by Summerfelt, Beratan and Gnade, now abandoned;

U.S. patent application Ser. No. 08/009,521, now U.S. Pat. No. 5,348,894 entitled "Improved Electrical Connections to Dielectric Materials" invented by Gnade and Summerfelt;

U.S. patent application Ser. No. 08/260,149, filed Jun. 15, 1994, entitled "Lightly Donor-Doped Electrodes for High-Dielectric-Constant Materials" invented by Summerfelt, Beratan and Gnade, now abandoned;

U.S. patent application Ser. No. 08/040,946, filed Mar. 31, 1993 entitled "Lightly Donor-Doped Electrodes for High-Dielectric-Constant Materials" invented by Summerfelt, Beratan and Gnade, now abandoned; and U.S. patent application Ser. No. 08/041,025, now U.S. Pat. No. 5,471,365 entitled "Improved Electrode Interface for High-Dielectric-Constant Materials" invented by Summerfelt and Beratan.

TECHNICAL FIELD OF THE INVENTION

This invention relates in general to the field of electronic devices, and more particularly to improved processing methods for high-dielectric-constant materials and electronic devices.

BACKGROUND OF THE INVENTION

The increasing need for high density capacitive structures such as dynamic random access memory cells has led to the use of high-dielectric-constant materials such as barium strontium titanate and the like, whose high permittivity allows for extremely high capacitive storage capability in a very small area. These high-dielectric-constant materials are usually applied using metal organic chemical vapor deposition techniques, which create significant problems due to the contamination of water and hydrocarbon materials on the surface of the high-dielectric-constant materials and in the bulk of the high-dielectric-constant material. These contaminants can greatly degrade the performance of devices made using the high-dielectric-constant materials. In most cases, processing techniques that are used to deposit and clean dielectric materials do not work well with these high-dielectric-constant materials due to their peculiar susceptibility to contamination from water and hydrocarbons.

SUMMARY OF THE INVENTION

As such, a need has arisen for processing techniques for depositing and purifying high-dielectric-constant layers in electronic devices which use such materials.

According to the teachings of the present invention, processing methods for treating layers of high-dielectric-constant material are provided that substantially eliminate or reduce problems associated with the prior art devices and methods.

According to one embodiment of the present invention, a method for forming a layer of high-dielectric-constant material is provided that comprises the steps of depositing a layer of high-dielectric-constant material. The method further comprises the step of exposing the layer to ultraviolet radiation in an oxygen and ozone ambient. The layer is then etched using a high pressure isotropic reactive ion etch at elevated temperature. The layer is then exposed to a low pressure plasma comprising fluorine in a low temperature environment. An outer electrode layer is then deposited outwardly from the high-dielectric-constant layer.

BRIEF DESCRIPTION OF THE DRAWINGS

A more complete understanding of the teachings of the present invention may be acquired by referring to the accompanying figures, in which like reference numbers indicate like features and wherein.

DETAILED DESCRIPTION OF THE INVENTION

Figure 1:
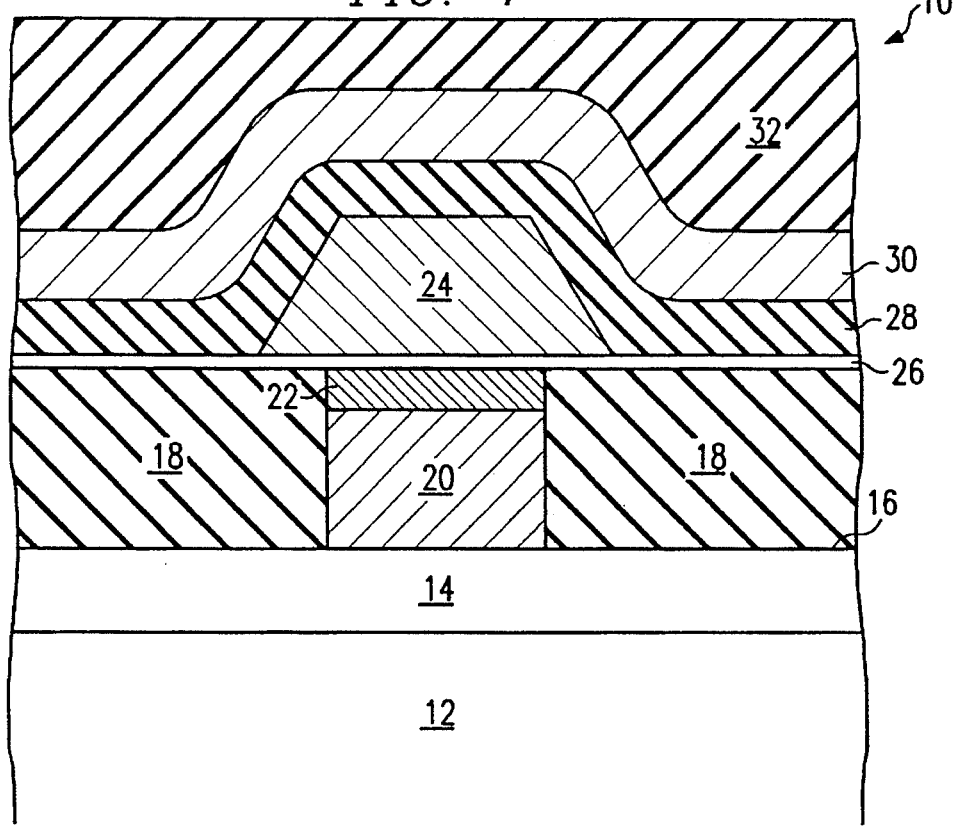
FIG. 1 is cross-sectional elevational diagram illustrating a memory cell constructed using processing techniques of the present invention.

Referring to FIG. 1, an electronic device, indicated generally at 10, is shown constructed on a semiconductor substrate 12. Semiconductor substrate 12 comprises a suitable semiconductor material such as silicon. Semiconductor substrate 12 may also comprise other single-component semiconductors such as germanium or diamond. In addition, substrate 12 may comprise compound semiconductors such as gallium arsenide, indium phosphide, silicon germanium, gallium nitride or silicon carbide.

Substrate 12 comprises an active region 14 which is formed proximate an outer surface 16 of substrate 12. Active region 14 comprises diffused and non-diffused regions of active semiconductor devices formed in substrate 12. For example, active region 14 can contain conductive interconnects, resistors and transistors. The majority of the outer surface 16 is covered by an interlevel isolation layer 18 which may comprise, for example, silicon dioxide, boron phosphate silicate glass, or spin-on glass. Interlevel isolation layer 18 may also comprise multiple layers including diffusion barriers that may comprise, for example, silicon nitride. Diffusion barriers are especially useful when layers formed outwardly from interlevel isolation layer 18 comprise compounds which could migrate through interlevel isolation layer 18 and diffuse into active region 14. For example, if outer layers include lead compounds, diffusion barriers within interlevel isolation layer 18 can prevent such lead compounds from diffusing into active region 14.

During the construction of device 10, an opening is formed through interlevel isolation layer 18 to expose a portion of outer surface 16 of active region 14. A conductive plug 20 is then formed within the opening in contact with outer surface 16. Conductive plug 20 comprises an oxidizable material such as poly-crystalline silicon which has been doped to be rendered conductive. Conductive plug 20 may also comprise titanium nitride, titanium silicide, or other reactive metal compounds such as zirconium nitride, tantalum silicide, tungsten silicide, molybdenum silicide, nickel silicide, tantalum carbide, or titanium boride. In addition, conductive plug 20 may comprise other single-component semiconductors which have been doped to be rendered conductive, such as single- or poly-crystalline silicon or germanium. In addition, conductive plug 20 may comprise reactive metals such as tungsten, tantalum, titanium, or molybdenum. Conductive plug 20 may also comprise conductive carbides or borides such as boron carbide. Conductive plug 20 may also comprise doped compound semiconductors such gallium arsenide, indium phosphide, combinations of silicon and germanium, and silicon carbide. Conductive plug 20 may also comprise a variety of combinations of the above-referenced materials.

A barrier layer 22 is also formed in the opening through interlevel isolation layer 18 in conductive contact with conductive plug 20. Barrier layer 22 operates to isolate the conductive plug 20 from the material within an inner electrode 24 formed outwardly from and completing covering barrier layer 22 and formed outwardly from portions of interlevel isolation layer 18, as shown in FIG. 1.

Barrier layer 22 may comprise, for example, titanium nitride. In addition, barrier layer 22 may comprise ternary or greater amorphous nitrides, such as Ta—Si—N, Ta—B—N, or Ti—B—N. Barrier layer 22 may also comprise a variety of exotic conductive nitrides such as Zr nitride, Hf nitride, Y nitride, Sc nitride, La nitride, and other rare earth nitrides such as N deficient Al nitride, doped Al nitride, Mg nitride, Ca nitride, Sr nitride, and Ba nitride. In addition, barrier layer 22 may comprise alloys of the above exotic conductive nitrides with common silicon processing materials, such as titanium nitride, gallium nitride, Ni nitride, Co nitride, Ta nitride, and W nitride. In addition, barrier layer 22 may comprise a variety of noble metal insulator alloys such as Pt—Si—N, Pd—Si—O, Pd—B—(O,N), Pd—Al—N, Ru—Si—(O,N), Ir—Si—O, Re—Si—N, Rh Al—O, Au—Si—N, or Ag—Si—N. In addition, barrier layer 22 may comprise heterogenous structures comprising multiple layers and combinations of the above-referenced materials.

Inner electrode 24 comprises an oxygen-stable material such as platinum or ruthenium oxide. In addition, inner electrode 24 may comprise other noble or platinum group metals or alloys thereof such as palladium, iridium, rhenium, rhodium, gold, or silver. In addition, inner electrode 24 may comprise conductive metal compounds such as ruthenium oxide, tin oxide, indium oxide, rhenium oxide, osmium oxide, rhodium oxide, iridium oxide, or doped tin, indium or zinc oxide. In addition, inner electrode 24 may comprise conductive perovskite-like materials such as $YBa_2Cu_3O_{7-x}$, $(La,Sr)CoO_3$, or $SrRuO_3$. In addition, inner electrode 24 may comprise heterostructures comprising combinations of the above materials.

Prior to the deposition of the layer used to form inner electrode 24, an adhesion layer 26 is deposited everywhere that the layer used to form inner electrode 24 is deposited. Adhesion layer 26 may comprise an extremely thin layer of titanium or tantalum, or other suitable material. Adhesion layer 26 is anywhere from 3 to 50 Å in thickness and is preferably on the order of 10 to 20 Å in thickness. The materials used to form inner electrode 24 do not adhere well to dielectric materials that have been exposed to air. As such, the adhesion layer 26 is deposited in order to create an in situ dielectric layer on which the inner electrode 24 may adhere. The adhesion layer 26 is not exposed to an air ambient after deposition and prior to the deposition of the layer used to form inner electrode 24. The material used to form inner electrode 24 will adhere much better to the titanium or tantalum within adhesion layer 26 than would be the case if the inner electrode 24 was placed in direct contact with interlevel isolation layer 18. The adhesion layer 26 also is disposed between the barrier layer 22 and the inner electrode 24. During the operation of the device, charge carriers must pass between inner electrode 24 and barrier layer 22 through the adhesion layer 26. Even though the adhesion layer 26 becomes a dielectric during processing, it will not appreciably affect the conductivity of device 10 because it is only on the order of 5 to 10 Å in thickness.

Figure 2A:
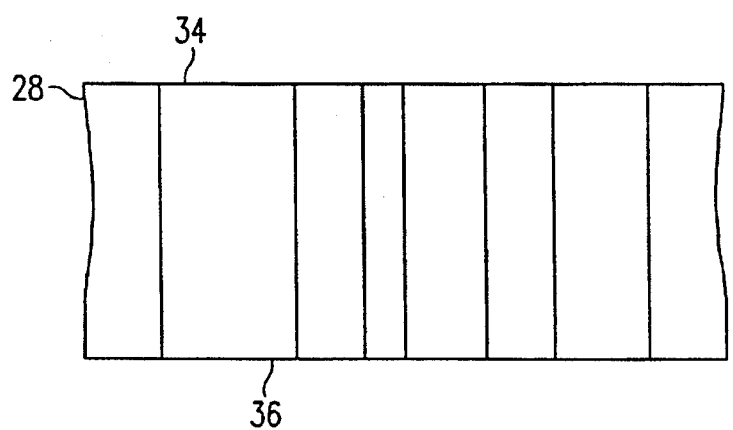
FIGS. 2A and B are cross-sectional diagrams illustrating different modes of crystalline growth in a high-dielectric-constant material.

Referring to FIG. 2A a greatly enlarged view of high-dielectric-constant layer 28 is shown. In FIG. 2A, the columnar growth of individual grains within high-dielectric-constant layer 28 is illustrated. As shown in FIG. 2A, columnar growth of single crystalline grains is characterized by grain boundaries which extend from an outer surface 34 to an inner surface 36 of layer 28.

Figure 2B:
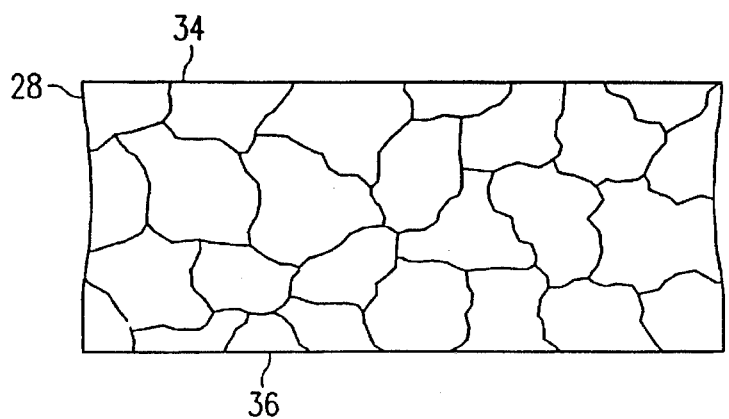

In contrast, FIG. 2B illustrates a greatly enlarged view of layer 28 which shows equiaxed grain growth within layer 28. Equiaxed grain growth is characterized by smaller single crystalline grains which do not extend all the way from outer surface 34 to inner surface 36.

During the deposition of high-dielectric-constant layer 28, a number of undesirable compounds may form. For example, if layer 28 is constructed of barium strontium titanate, the metal organic environment ordinarily used in an MOCVD process can result in the formation of barium hydroxide, barium carbonate, strontium hydroxide and strontium carbonate. These hydroxide and carbonate compounds may form on the outer surface 34 of layer 28 or along the grain boundaries illustrated in FIGS. 2A and 2B. These hydroxide and carbonate compounds can degrade the electric characteristics of the high-dielectric-constant material.

As such, prior to the deposition of the outer electrode layer 30, it is advantageous to perform several processing steps to reduce or eliminate the presence of these hydroxide and carbonate compounds.

The first processing step which may be performed prior to the deposition of the outer electrode 30 and after the deposition of the high-dielectric-constant layer 28 is to irradiate the layer 28 with ultraviolet radiation in an ambient mixture of oxygen and/or ozone and/or $N_2O$. This process can be performed at a relatively broad range of temperatures, anywhere from 200° to 600° C. Optimally, the irradiation can occur on the order of 400° to 500° C. The ultraviolet radiation should be configured such that it contains photons more energetic than the band gap of the high-dielectric-constant material. For example, if barium strontium titanate is used to form layer 28, the photon should be more energetic than 2.4 electron volts. A more preferred anneal uses an 8% ozone in oxygen mixture in a cold wall reactor with a 500° C. substrate under UV radiation of $>10^{31}$ $^3w/cm^2$ for wavelength smaller than 350 nm. The UV radiation penetrates less than 1 cm through for 1 a+m $0_2$ or less than 20 cm for 1 Torr $O_2$.

The presence of ozone and ultraviolet radiation gives rise to the formation of oxygen radicals. Further, the ultraviolet radiation increases the diffusion of impurities within the bulk material of layer 28 and along the grain boundaries within layer 28. As such, the undesirable compounds within the layer 28 react with the oxygen radicals and diffuse out of layer 28.

A second processing step which may be used to purify layer 28 prior to deposition of layer 30 is to etch the outer surface using a dry etch such as reactive ion etcher or ion-mill. The etch should contain $O_2$ and possibly an able gas such as Ar, He, Ne, Xe or Kr and might also utilize gases containing halogens such as F, Cl, Br, Io. Impurities concentrated at the surface of layer 28 include carbonates, hydroxides, organics as well as possibly amorphous or non-stoichiometric deposited material. The etch can occur either at room temperature or at elevated temperatures. If etch occurs at low temperatures (<250° C.) then a second anneal step either purely thermal or enhanced with photons or plasma might be needed. The first preferred etch uses an Oz/Ar ½ gas mixture at 100 mTorr at 400° C. such that 50Å of layer 28 are removed. The second preferred etch uses an $O_2/Ar/C/2$ $$\left( \frac{1/2}{1} \right)$$

mixture at 100 mTorr at (20°–100° C.) such that an average 100 Å of layer 28 is removed followed by 600° C. $O_2$ 1atm 15 min anneal. The reactive ion etch process should be performed in situ or in a cluster tool configuration with the process used to deposit layer 30 so that the etched outer surface of layer 28 is not exposed to air ambient before layer 30 is deposited.

An additional process step which can be performed following the reactive ion etch is to expose the etched outer surface of layer 28 to fluorine carried in a low pressure plasma. This can be accomplished by mixing fluorine, argon and, optionally, oxygen in a low pressure plasma at a reduced temperature on the order of 300° C. or below. The lower pressure plasma serves to create reactive fluorine, which dopes the interface between outer surface 34 of layer 28 and the inner surface of outer electrode layer 30 with fluorine. The use of fluorine at this interface has been shown to reduce leakage currents and improve the ferroelectric properties of the high-dielectric-constant material used in layer 28.

Although the proceeding process steps were listed in a particular order, they can be used individually or in different combinations or different order.

Although the present invention has been described in detail it should be understood that various changes, alterations, substitutions and modifications may be made to the teachings described herein without departing from the spirit and scope of the present invention, which is solely defined by the appended claims.

What is claimed is:

1. A method of forming an electronic device comprising the steps of:

depositing a layer of barium strontium titanate material on a surface;

irradiating the layer of barium strontium titanate material with ultraviolet radiation comprising photons more energetic than the band gap of the barium strontium titanate material in an ambient including ozone; and etching the outer surface of the layer of barium strontium titanate material in a reactive ion etch process which includes oxygen and argon to substantially reduce the amount of hydroxide and carbonate contaminants on the outer surface of the layer.

2. The method of claim 1, wherein said step of etching comprises the step of etching at a temperature in the range of 300° to 600° C.

3. The method of claim 1, and further comprising the step of depositing a layer of outer electrode material outwardly from the layer of barium strontium titanate material without exposing the outer surface of the barium strontium titanate material to an air ambient prior to the deposition of the outer electrode material.

\* \* \* \* \*